(12) United States Patent
Horiuchi et al.

(10) Patent No.: US 8,420,414 B2
(45) Date of Patent: Apr. 16, 2013

(54) METHOD OF MANUFACTURING LIGHT-EMITTING DEVICE

(75) Inventors: Megumi Horiuchi, Minamitsuru-gun (JP); Shunichi Watanabe, Minamitsuru-gun (JP)

(73) Assignees: Citizen Electronics Co., Ltd., Yamanashi (JP); Citizen Holdings Co., Ltd., Tokyo (JP)

( * ) Notice: Subject to any disclaimer, the term of this patent is extended or adjusted under 35 U.S.C. 154(b) by 210 days.

(21) Appl. No.: 13/085,909

(22) Filed: Apr. 13, 2011

(65) Prior Publication Data
US 2011/0250711 A1 Oct. 13, 2011

(30) Foreign Application Priority Data
Apr. 13, 2010 (JP) ............................. P-2010-092435

(51) Int. Cl.
*H01L 21/20* (2006.01)
(52) U.S. Cl.
USPC ......... 438/26; 438/33; 438/113; 257/E21.499
(58) Field of Classification Search ............... 438/22, 438/26, 28, 33, 34, 68, 106–114, 459–464
See application file for complete search history.

(56) References Cited

U.S. PATENT DOCUMENTS

| 6,498,392 | B2 | 12/2002 | Azuma |
| 6,888,231 | B2 | 5/2005 | Maeda |
| 2003/0160258 | A1* | 8/2003 | Oohata ........................ 257/99 |
| 2008/0224161 | A1 | 9/2008 | Takada |
| 2008/0290359 | A1* | 11/2008 | Inoue et al. .................. 257/98 |
| 2010/0127290 | A1* | 5/2010 | Joo et al. ..................... 257/98 |
| 2012/0273808 | A1* | 11/2012 | Kim et al. .................... 257/88 |

FOREIGN PATENT DOCUMENTS

| JP | 2001210743 A | 8/2001 |
| JP | 2001326295 A | 11/2001 |
| JP | 2008186946 A | 8/2008 |
| JP | 2008227166 A | 9/2008 |

* cited by examiner

*Primary Examiner* — Savitr Mulpuri
(74) *Attorney, Agent, or Firm* — Browdy and Neimark, PLLC

(57) ABSTRACT

A method of manufacturing a light-emitting device includes forming a planar board that includes a plurality of first metallic plates and a plurality of second metallic plates continuously connected by a resin, by use of a positioning frame including a plurality of first concave portions and a plurality of second concave portions, mounting a plurality of light-emitting diode elements on the planar board, and sealing the light-emitting diode elements collectively, thereby producing a plurality of light-emitting devices.

6 Claims, 11 Drawing Sheets

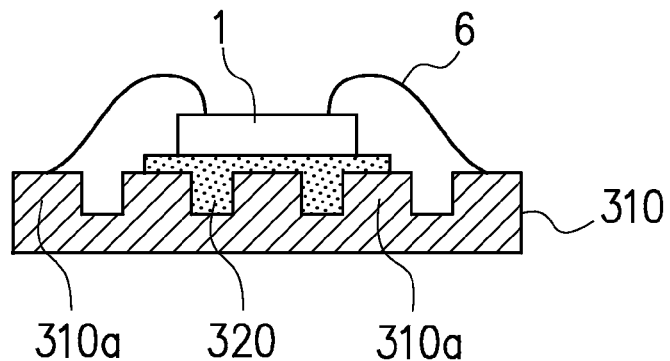
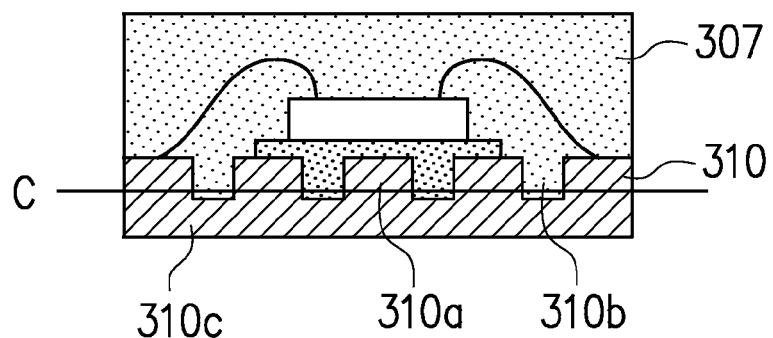
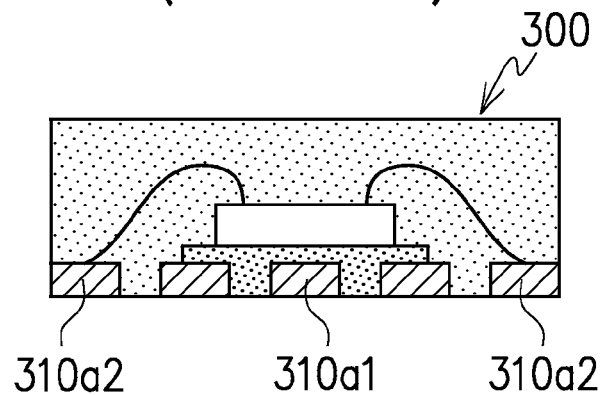

METHOD OF MANUFACTURING LIGHT-EMITTING DEVICE

CROSS-REFERENCE TO RELATED APPLICATION

This application is based on and claims the priority benefit of Japanese Patent Application No. 2010-92435, filed on Apr. 13, 2010, the disclosure of which is incorporated herein by reference in its entirety.

BACKGROUND OF THE INVENTION

1. Field of the Invention

The present invention relates to a method of manufacturing a light-emitting device including a light-emitting diode element (hereinafter, referred to as LED element) or the like, more specifically, to a method of manufacturing a light-emitting device having a high heat-release property, and capable of miniaturization and thinning.

2. Description of the Related Art

An LED element has widely been used for a backlight of a color display, illumination or the like, because the LED element has a long service life and can be miniaturized, has excellent driving characteristics and high light-emitting efficiency, and is capable of emitting bright emission color.

In particular, there is proposed a light-emitting device in which an LED element is directly disposed on a metallic plate having excellent heat-release property and the metallic plate is used as an output electrode (for reference, see Japanese Patent Application Publication Nos. 2001-326295, 2008-186946 and 2001-210743).

Conventional light-emitting devices using metallic plates as output electrodes are described.

FIG. 6 is a sectional view showing a conventional light-emitting device as disclosed in Japanese Patent Application Publication No. 2001-326295. In FIG. 6, the light-emitting device 100 has a structure including a first metallic frame 102 on which an LED element 101 is mounted, a second metallic frame 103 for an electrode to which at least one of p-n element electrodes of the LED element 101 is electrically connected by a wire 106, and a sealing resin 107 to seal the mounted LED element 1. The first metallic frame 102 and the second metallic frame 103 are integrally connected by the sealing resin 107.

FIGS. 7, 8 and 9 illustrate a conventional light-emitting device as disclosed in Japanese Patent Application Publication No. 2008-186946.

FIG. 7 is a plan view of a lead frame 210, FIG. 8 is a plan view of a lead frame 210 on which LED elements 1 are mounted, and FIGS. 9A to 9C are sectional views of a light-emitting device 200. The drawings show a configuration of the light-emitting device in a simplified state within a required scope.

In FIG. 7, the lead frame 210 is provided with first metallic plates 212 and second metallic plates 213 formed through a process for punching the lead frame 210, each of the first metallic plates 212 having a connecting electrode 214 formed at one side and each of the second metallic plates 213 having a connecting electrode 214 formed at one side. Note that FIG. 7 shows a structure to manufacture a plurality of light-emitting devices 200 simultaneously. The lead frame 210 includes a plurality of setting members necessary to assemble the light-emitting device. The setting members comprise the first metallic plates 212, the second metallic plates 213 and connecting frames 215 formed between the first metallic plates 212 and between the second metallic plates 213, respectively.

FIG. 8 is a plan view showing a state where the LED elements 1 are mounted on the lead frame 210 as shown in FIG. 7. After each of the LED elements 1 is mounted on an upper surface of each of the first metallic plates 212, the p-electrode and the n-electrode of each of the LED elements 1 are electrically connected to the first metallic plate 212 and the second metallic plate 213 through wires 6, respectively, and a portion surrounded by a dotted line is sealed by the sealing resin 207. Meanwhile, a dashed line surrounding each of the LED elements 1 indicates a sealing resin 207a configuring a light-emitting device 200 (mentioned below).

FIGS. 9A to 9C are sectional views showing processes of manufacturing the light-emitting device 200. More specifically, FIG. 9A is a sectional view taken along the line A-A in FIG. 8 showing the sealing resins 207a shown by the dashed line, FIG. 9B is a sectional view showing the connecting electrodes 214 of the first metallic plate 212 and the second metallic plate 213, which are bent downward and folded on a lower surface of the lead frame to act as outer electrodes, and FIG. 9C is a side view showing the light-emitting device 200, in which the LED elements 1, the first and second metallic plates 212 and 213 (shown by a dotted line) are provided. A part of the lead frame 210 cut in a cutting and separating process is exposed from a side surface of the light-emitting device as a cut surface 216.

A conventional light-emitting device disclosed in Japanese Patent Application Publication No. 2001-210743 is described with reference to FIGS. 10A and 10B, and 11A to 11C. FIG. 10A is a plan view of a metallic base 310, and FIG. 10B is a sectional view taken along the line B-B in FIG. 10A showing the metallic base 310. Island-shaped convex portions 310a separated in a grid pattern by concave portions 310b are arranged on the metallic base 310 in a matrix.

FIGS. 11A to 11C are sectional views showing processes of manufacturing a light-emitting device 300. FIG. 11A illustrates a state where one LED element 1 is mounted on three convex portions 310a, the LED element 1 is fixed to the metallic base 310 by a mount material 320 such as a silver paste or the like, and electrically connected to circumferential convex portions 310a by wires 6. In this state, the entire convex portions 310a are in an electrical short-circuit.

FIG. 11B illustrates a state where the LED element 1 mounted on the metallic base 310 is sealed by a sealing resin 307. From this state, a bottom portion 310c of the metallic base 310 is cut along a line C to achieve a state where the bottom portion 310c is cut, as shown in FIG. 11C. That is, the convex portions 310a1 on which the LED element 1 is mounted and the convex portions 310a2 to which the wires are connected are electrically separated, whereby the convex portions 310a2 function as outer electrodes.

By the way, in the proposal shown in Japanese Patent Application Publication No. 2001-326295, the first metallic plate 102 on which the LED element 101 is mounted, and the second metallic plate 103 to which the element electrode of the LED element 101 is electrically connected by the wire 106 are connected and integrated by the sealing resin 107. Here, a transparent or light-transmitting silicone resin is typically used for the sealing resin 107. However, the first metallic plate 102 and the second metallic plate 103 cannot be connected securely with the strength of the silicone resin, and since it is necessary to provide steps 102a and 103a on lower surfaces of the first and second metallic plates 102 and 103 and reinforce the connection thereof with the sealing resin 107, as shown in FIG. 6, there is a problem that the first metallic frame 102 and the second metallic frame 103 have a complicated shape.

In the proposal shown in Japanese Patent Application Publication No. 2008-186946, because it is necessary to cut a complex of metal and resin after the lead frame 210 as a metallic frame is molded by the sealing resin 207, a method of cutting the light-emitting device 200 is limited to a practical press work. In addition, because a part of the lead frame 210 is exposed from a side surface of the light-emitting device 200 as cutting surfaces 216, as shown in FIG. 9C, water enters an inside of the light-emitting device 200 through the exposed part, hence there is a possibility that characteristics of the light-emitting device 200 deteriorate.

In the proposal shown in Japanese Patent Application Publication No. 2001-210743, in the complete process of the light-emitting device 300, because a process of cutting the bottom portion 310c of the metallic base 310 is required, there is a problem that the manufacturing process is unsuitable for mass production.

SUMMARY OF THE INVENTION

According to an embodiment of the present invention, a method of manufacturing a light-emitting device includes positioning at least one first metallic plate in at least one first concave portion of a positioning frame and at least one second metallic plate in at least one second concave portion of the positioning frame, adhering a surface of an adhesive sheet to the first metallic plate in the first concave portion of the positioning frame and the second metallic plate in the second concave portion of the positioning frame, removing the first metallic plate and the second metallic plate that are adhered to the adhesive sheet, from the first concave portion and the second concave portion of the positioning frame, filling a resin in spaces except the first metallic plate and the second metallic plate on the surface of the adhesive sheet to form a planar board including the first metallic plate and the second metallic plate connected by the resin, removing the adhesive sheet from the planar board, mounting at least one light-emitting diode element that includes a pair of a first element electrode and a second element electrode, on the first metallic plate, electrically connecting one of the first and second element electrodes of the light-emitting diode element, to the second metallic plate by at least one wire, and forming a sealing resin on a side of the planar board, the side being a side where the light-emitting diode element is mounted on the first metallic plate.

According to another embodiment of the present invention, electrical connection between an LED element and a first metallic plate and a second metallic plate can be achieved without wires. The embodiment of the present invention to manufacture a light-emitting device includes positioning at least one first metallic plate in at least one first concave portion of a positioning frame and at least one second metallic plate in at least one second concave portion of the positioning frame, adhering a surface of an adhesive sheet to the first metallic plate in the first concave portion of the positioning frame and the second metallic plate in the second concave portion of the positioning frame, removing the first metallic plate and the second metallic plate that are adhered to the adhesive sheet, from the first concave portion and the second concave portion of the positioning frame, filling a resin in spaces except the first metallic plate and the second metallic plate on the surface of the adhesive sheet to form a planar board including the first metallic plate and the second metallic plate connected by the resin, removing the adhesive sheet from the planar board, mounting at least one light-emitting diode element that includes a pair of element electrodes, on the first metallic plate and the second metallic plate, with the respective element electrodes of the light-emitting diode element in contact with the respective first and second metallic plates through bumps, and forming a sealing resin on a side of the planar board, the side being a side where the light-emitting diode element is mounted on the first metallic plate and the second metallic plate. These embodiments of manufacturing a light-emitting device can be used for manufacturing a plurality of light-emitting devices collectively, as explained in the DETAILED DESCRIPTION OF THE PREFERRED EMBODIMENTS.

BRIEF DESCRIPTION OF THE DRAWINGS

FIGS. 11A to 11C are sectional views showing processes for manufacturing a light-emitting device using the metallic base as shown in FIG. 10A.

DETAILED DESCRIPTION OF THE PREFERRED EMBODIMENTS

Preferred embodiments of the present invention will be explained hereinafter in detail with reference to the accompanying drawings.

Figure 1:
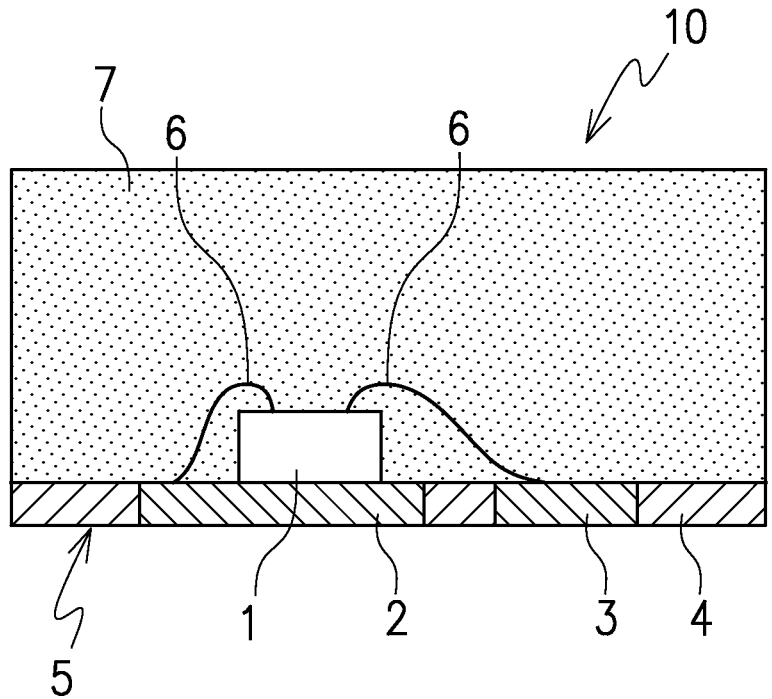
FIG. 1 is a sectional view showing a light-emitting device obtained by a method of manufacturing a light-emitting device according to the present invention.
Figure 2:
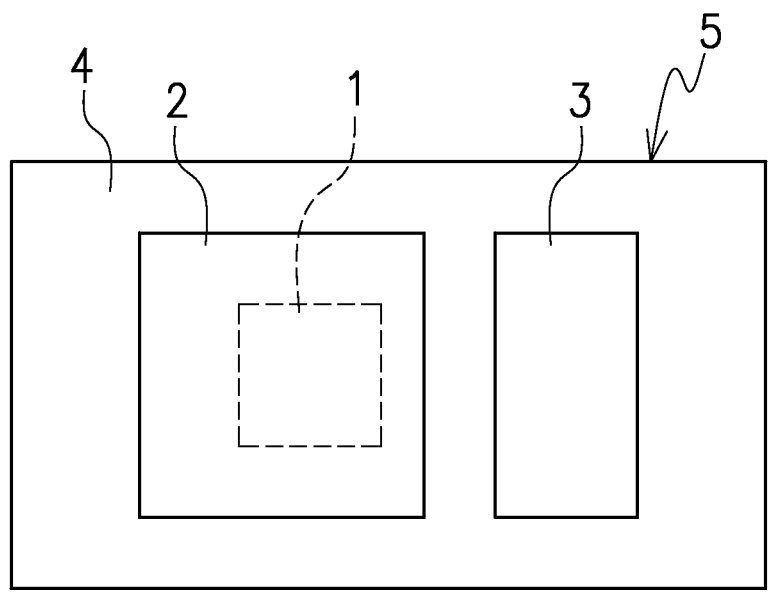
FIG. 2 is a bottom view of the light-emitting device as shown in FIG. 1.

FIGS. 1 and 2 illustrate a light-emitting device obtained by a method of manufacturing the light-emitting device according to the present invention. As shown in FIG. 1, the light-emitting device 10 includes a planar board 5 including a first metallic plate and a second metallic plate, an LED element 1 mounted on one of the first metallic plate and the second metallic plate of the planar board 5, and a sealing resin 7 formed on a side of the planar board 5, the side being a side where the light-emitting diode element is mounted on the one of the first metallic plate and the second metallic plate. The first and second metallic plates each have a flat shape at upper and lower surfaces. The LED element 1 here includes a pair of a first element electrode and a second element electrode on an upper surface of the LED element 1, the upper surface being opposite a lower surface mounted on the one of the first metallic plate and the second metallic plate of the planar board 5.

In more detail, the planar board 5 includes a first metallic plate 2, a second metallic plate 3, a resin 4 disposed between the first metallic plate 2 and the second metallic plate 3 and connecting the first metallic plate 2 and the second metallic plate 3. The LED element 1 is mounted on, for example, the first metallic plate 2 directly. The LED element 1 includes a pair of a first element electrode and a second element electrode (not shown) at the upper surface of the LED element 1, and one of the first element electrode and the second element electrode is electrically connected to the second metallic plate 3 by at least one wire. Another of the first element electrode and the second element electrode may be electrically connected by at least one wire to the first metallic plate 2, on which the LED element 1 is mounted. In particular, the first metallic plate 2 on which the LED element 1 is mounted is preferably made of a metallic material which has a high heat-release property to release heat generated in the LED element 1 to exterior of the light-emitting device 10.

The resin 4 connecting the first metallic plate 2 and the second metallic plate 3 is preferably made of a resin material having a strong adhesive force, for example, epoxy resin, silicone resin or the like. The first metallic plate 2 and the second metallic plate 3 are arranged in the planar board 5 with upper and lower surfaces of the first and second metallic plates 2 and 3 exposed at upper and lower surfaces of the planar board 5. The resin 4 is disposed on side surfaces of the first metallic plate 2 and the second metallic plate 3 to connect the first metallic plate 2 and the second metallic plate 3, and forms a shape of planar board 5. Because the first metallic plate 2 and the second metallic plate 3 are connected by the resin 4 having the strong adhesive force, a rigid planar board shape 5 can be formed (see FIG. 1).

The sealing resin 7 disposed on the side of the planar board 5, the side being a side where the LED element 1 is mounted, seals the LED element 1, upper surfaces of the first metallic plate 2 and the second metallic plate 3, and the wires 6 connecting the first and second element electrodes of the LED element 1 to the first and second metallic plates 2 and 3, respectively. The sealing resin 7 comprises, for example, a transparent resin or a light-transmitting resin, in which fluorescent particles may be mixed. Also, if an LED element including a first element electrode on a lower surface of the LED element and a second element electrode on an upper surface of the LED element is used in a light-emitting device 10, the first element electrode may be electrically in contact with the first metallic plate 2 and the second element electrode may be electrically connected to the second metallic plate 3 by at least one wire. The first element electrode may be directly and electrically in contact with the first metallic plate, or may be electrically in contact with the first metallic plate through one selected from among bumps, soldering, an electrically conductive adhesive, and so on. Furthermore, if an LED element including a first element electrode and a second element electrode disposed on a lower surface of the LED element is used in a light-emitting device, the LED element may be mounted on the first metallic plate and the second metallic plate with the respective first and second element electrodes of the light-emitting diode element electrically in contact with the respective first and second metallic plates. The first and second element electrodes may be directly and electrically in contact with the first and second metallic plates, or may be electrically in contact with the first and second metallic plates through one selected from among bumps, soldering, electrically conductive adhesive, and so on.

Meanwhile, the sealing resin 7 is preferably made of silicone resin in consideration of mixing of the fluorescent particles, or workability.

Lower surfaces of the first and second metallic plates 2 and 3 are exposed from a bottom surface of the basic board 5, as shown in FIG. 2. By electrically connecting each of the lower surfaces of the first and second metallic plates 2 and 3 to an exterior circuit (not shown), it is possible to light the LED element 1 and release heat generated in the LED element 1 through at least the first metallic plate 2 having large heat capacity to exterior. If the LED element with the pair of first and second element electrodes disposed on the lower surface of the LED element is used, it is possible to light the LED element and release heat generated in the LED element 1 through both the first metallic plate 2 and the second metallic plate 3 to outside of the light-emitting device 10.

Next, a method of manufacturing the light-emitting device 10 is described with reference to FIGS. 3A to 3L.

FIGS. 3A to 3D illustrate positioning a plurality of pairs of the first metallic plate 2 and the second metallic plate 3 in a plurality of pairs of a first concave portion and a second concave portion of a positioning frame at predetermined intervals formed between the first concave portions and the second concave portions, adhering a surface of an adhesive sheet 30 to the plurality of pairs of the first metallic plate and the second metallic plate, and removing the plurality of pairs of the first metallic plate and the second metallic plate that are adhered to the adhesive sheet, from the plurality of pairs of the first concave portion and the second concave portion of the positioning frame. FIGS. 3E to 3G illustrate filling a resin in spaces except the plurality of pairs of the first metallic plate and the second metallic plate on the surface of the adhesive sheet to form a planar board 5L including the plurality of pairs of the first metallic plate and the second metallic plate connected by the resin 4, and removing the adhesive sheet 30 from the planar board 5L. FIGS. 3H and 3I illustrate mounting a plurality of LED elements 1 on the planar board 5L. In more detail, FIG. 3H shows mounting the plurality of LED elements each including the first element electrode and the second element electrode on the upper surface of the LED element, on the first metallic plates 2 of the plurality of pairs and electrically connecting the first and second element electrodes to the first and second metallic plates, respectively, by wires. FIG. 3I shows mounting the plurality of LED elements 1 each including the first element electrode and the second element electrode on the lower surface of the LED element, mounting each of the light-emitting diode elements on the first metallic plate 2 and the second metallic plate 3 of each pair, with the first element electrode electrically in contact with the first metallic plate of each pair and with the second element electrode electrically in contact with the second metallic plate of each pair. In this case, the first and second element electrodes of the LED element 1 may be directly and electrically in contact with the first and second metallic plates, or may be electrically in contact with the first and second metallic plates through one selected from among bumps 8, soldering, electrically conductive adhesive, and so on, for electrical connection and fixing the LED elements on the first and second metallic plates. These processes show embodiments of a manufacturing method to produce a light-emitting device collectively. FIGS. 3J to 3K illustrate forming a sealing resin on a side of the planar board, the side being a side where the plurality of LED elements are mounted on the first metallic plates, and dividing the sealing resin on the planar board into a plurality of light-emitting devices.

Figure 3A:
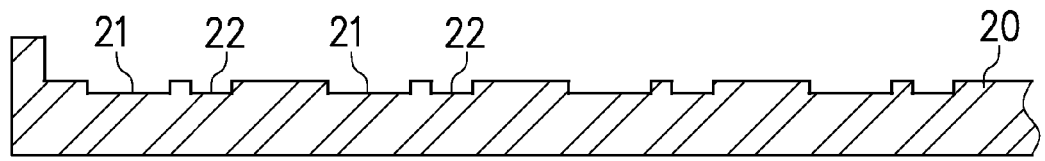
FIGS. 3A to 3L are sectional views showing manufacturing processes to manufacture a plurality of light-emitting devices collectively.
Figure 3B:
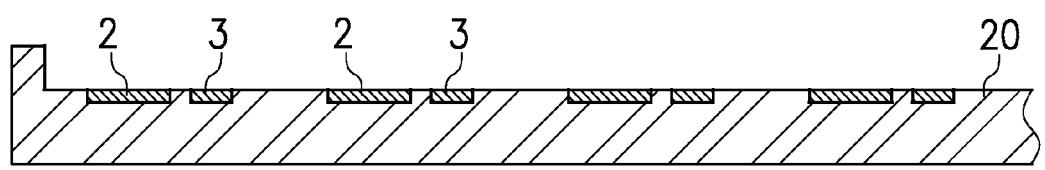
Figure 3C:
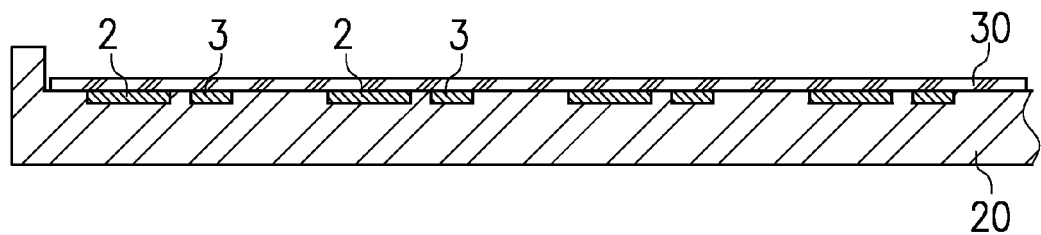
Figure 3D:
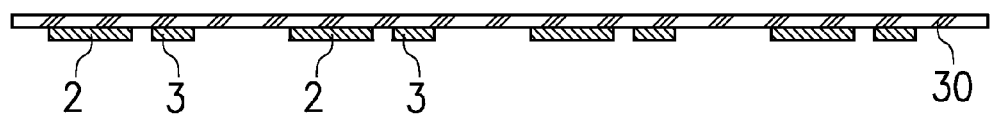
Figure 3E:
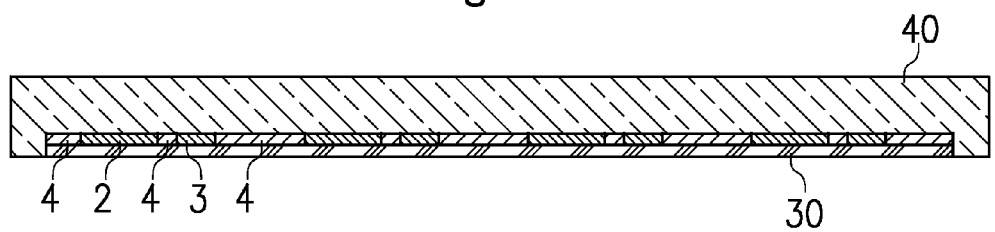
Figure 3F:
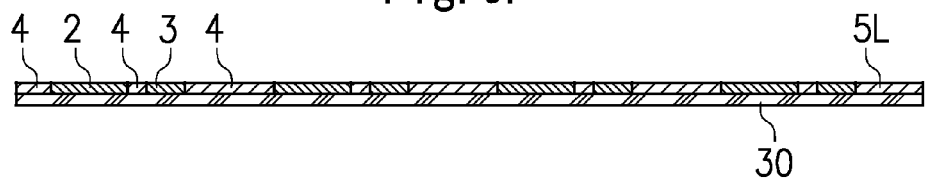
Figure 3G:
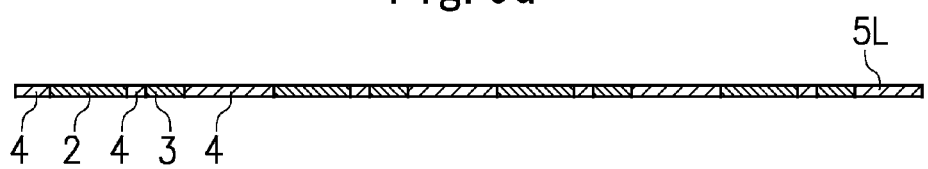
Figure 3H:
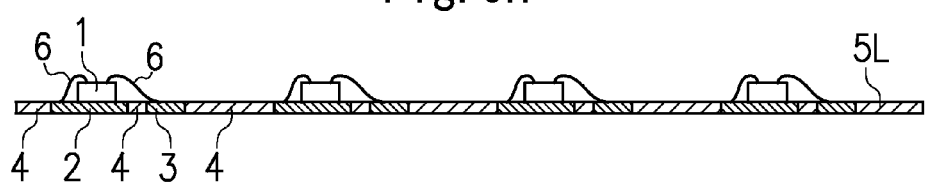
Figure 3I:
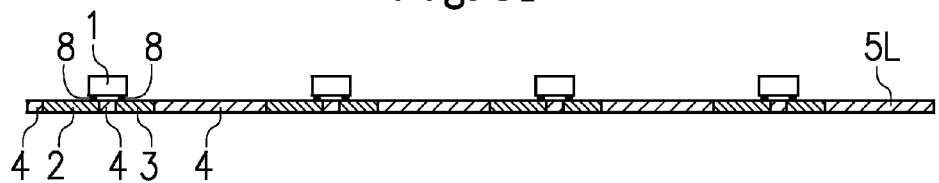
Figure 3J:
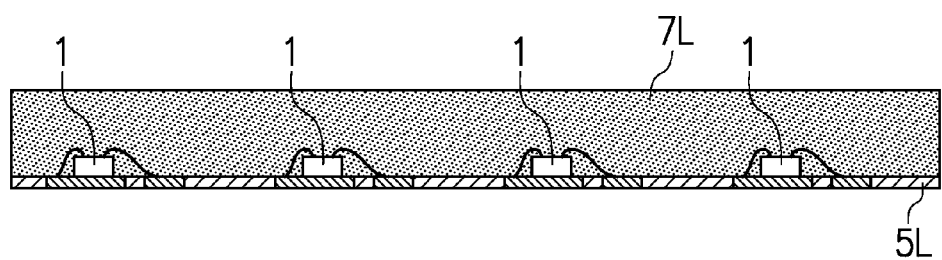
Figure 3K:
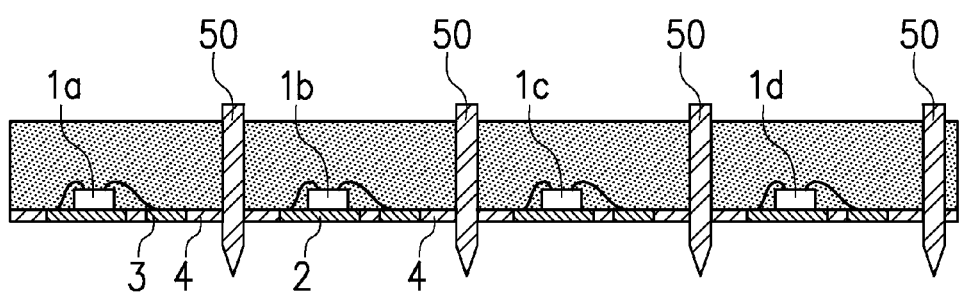
Figure 3L:
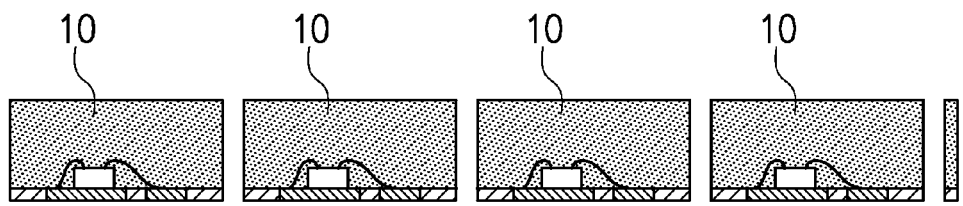

FIG. 3A illustrates a sectional view showing the positioning frame 20 made of a metal or resin. The positioning frame 20 includes a plurality of pairs of the first concave portion 21 and the second concave portion 22 to position a plurality of pairs of the first metallic plate 2 and the second metallic plate 3 collectively. FIG. 3B illustrates a state where the first metallic plates 2 and the second metallic plates 3 are inserted in the first concave portions 21 and the second concave portions 22 of the positioning frame 20, respectively. FIG. 3C illustrates a state where a surface of an adhesive sheet 30 is laid on the first metallic plates 2 and the second metallic plates 3 which are positioned in the first and second concave portions 21, 22 of the positioning frame 20 to adhere the surface of the adhesive sheet 30 to the pairs of the first metallic plate 2 and the second metallic plate 3. FIG. 3D illustrates a state of removing the plurality of pairs of the first metallic plate 2 and the second metallic plate 3 that are adhered to the adhesive sheet, from the plurality of pairs of the first concave portion and the second concave portion of the positioning frame. The first and second metallic plates 2 and 3 adhered to the adhesive plate 30 are arranged in a positional relation as pairs corresponding to the pairs of the first and second concave portions 21 and 22 of the positioning frame 20.

FIG. 3E illustrates filling a resin 40 in spaces except the plurality of pairs of the first metallic plate and the second metallic plate on the surface of the adhesive sheet to form a planar board including the plurality of pairs of the first metallic plate and the second metallic plate connected by a resin 4 that is inleted in spaces around side surfaces of the first and second metallic plates 2, 3 on the surface of the adhesive sheet 30. Unnecessary resin portion 40, except the resin 4 disposed around the side surfaces of the first and second metallic plates 2, 3, is removed.

FIG. 3F illustrates a planar board 5L formed on the surface of the adhesive sheet 30. FIG. 3G illustrates a planar board 5L including the plurality of pairs of the first metallic plate and the second metallic plate with upper surfaces and lower surfaces of the first metallic plates and the second metallic plates exposed at an upper surface and a lower surface of the planar board 5L, after removing the adhesive sheet 30 from the planar board 5L. The planar board 5L has a sheet shape.

FIG. 3H illustrates an embodiment of mounting a plurality of LED elements 1 on the first metallic plates 2 of the planar board 5L and electrically connecting the first and second element electrodes of the LED elements 1 to the first and second metallic plates 2, 3 by wires.

FIG. 3I illustrates an embodiment of mounting a plurality of LED elements 1 on the first and second metallic plates 2, 3 of the planar board 5L. FIG. 3J illustrates forming a sealing resin 7L on a side of the planar board 5L, the side being a side where the plurality of light-emitting diode elements are mounted on the first metallic plates to seal the plurality of LED elements 1 and upper surfaces of the first and second metallic plates 2, 3 and electrically connecting portions such as wires 6, bumps 8, and so on. FIG. 3K illustrates dividing the sealing resin 7L on the planar board into a plurality of light-emitting diode devices, more specifically, cutting through the sealing resin 7L and the planar board vertically and horizontally between the plurality of LED elements to produce a plurality of light-emitting devices, as shown in FIG. 3K.

Figure 4:
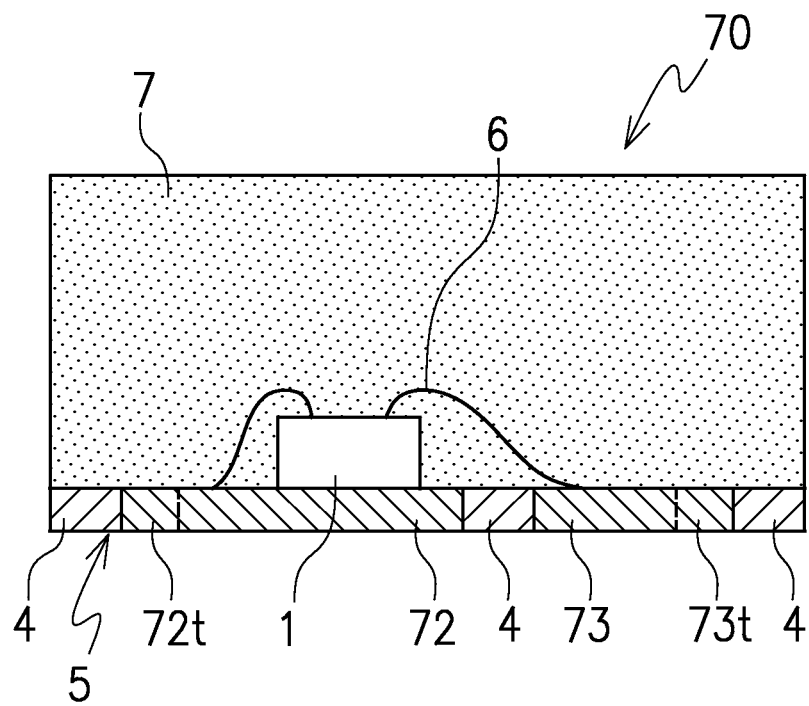
FIG. 4 is a sectional view showing another embodiment of a light-emitting device obtained by a method of manufacturing a light-emitting device according to the present invention.
Figure 5:
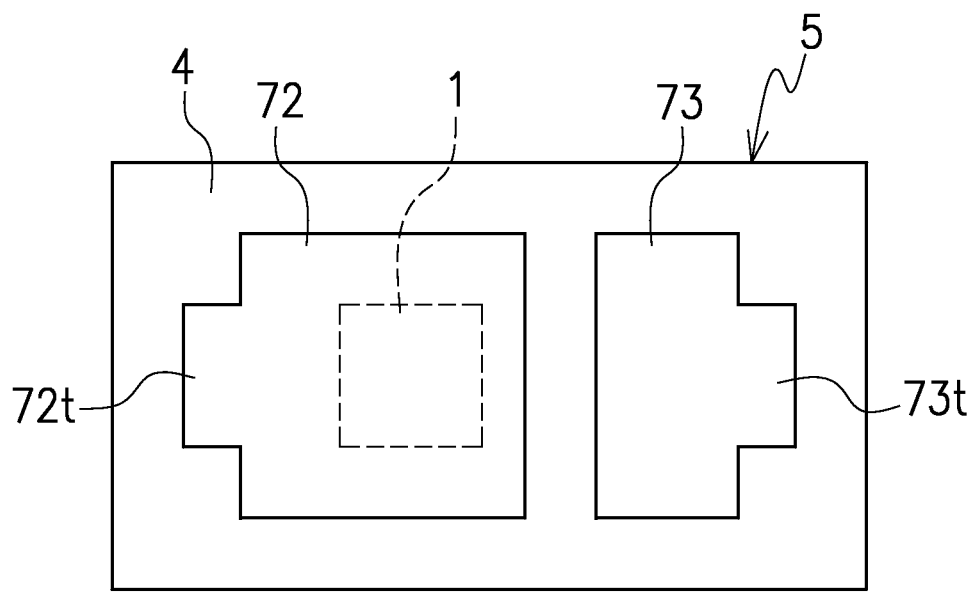
FIG. 5 is a bottom view of the light-emitting device as shown in FIG. 4.
Figure 6:
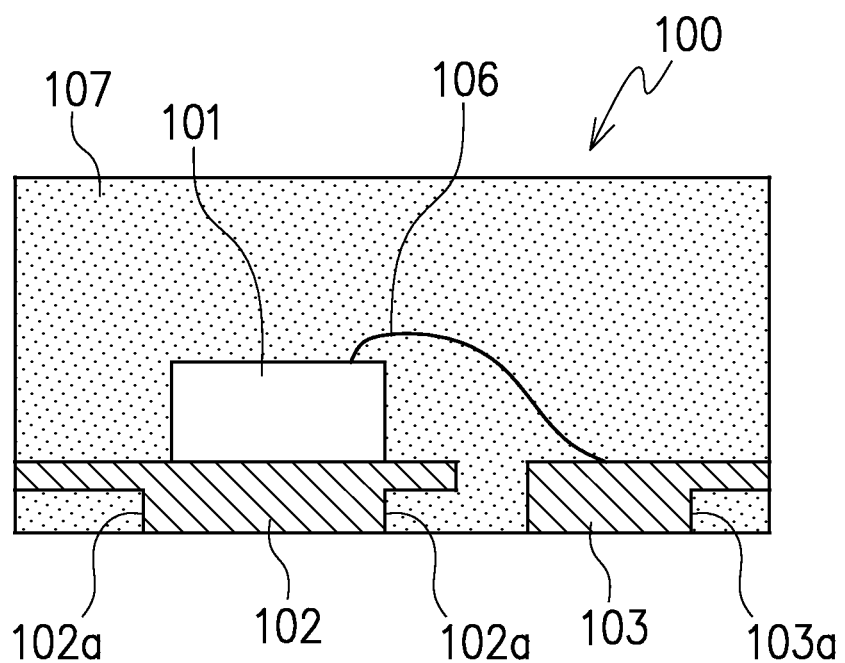
FIG. 6 is a sectional view showing one example of a conventional light-emitting device.
Figure 7:
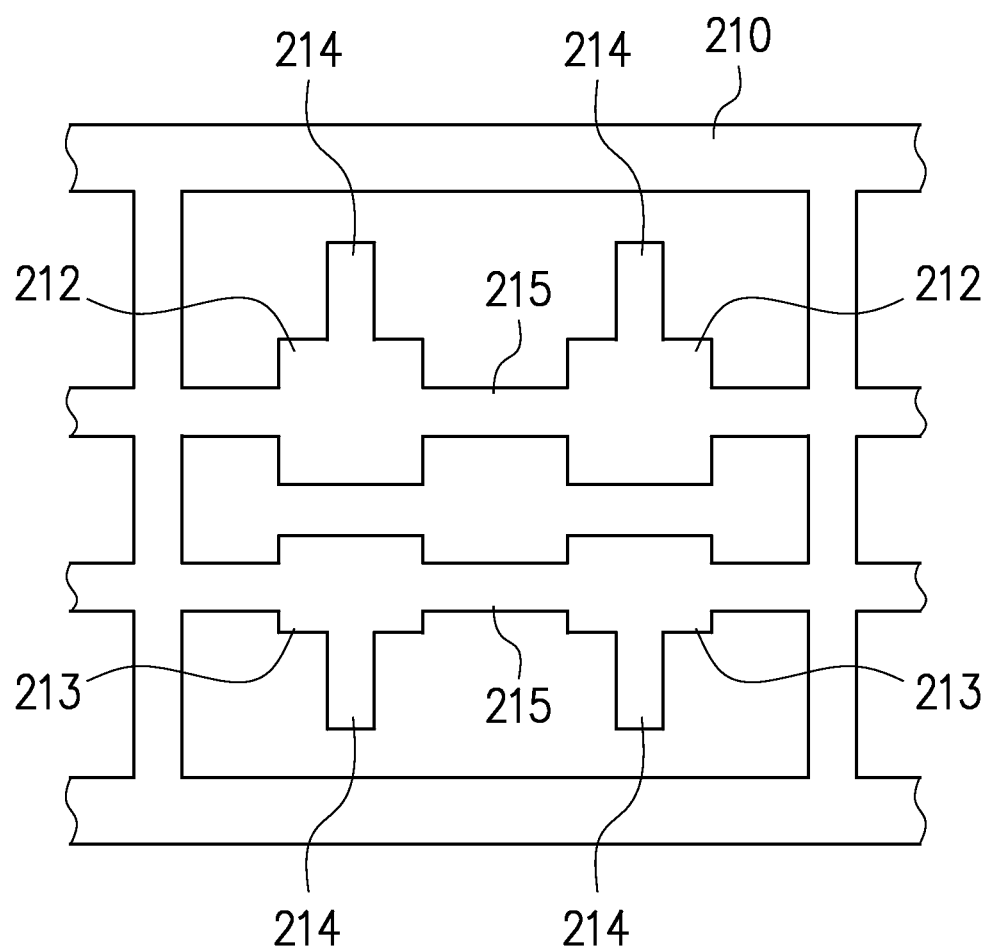
FIG. 7 is a plan view of a lead frame constituting a conventional light-emitting device.
Figure 8:
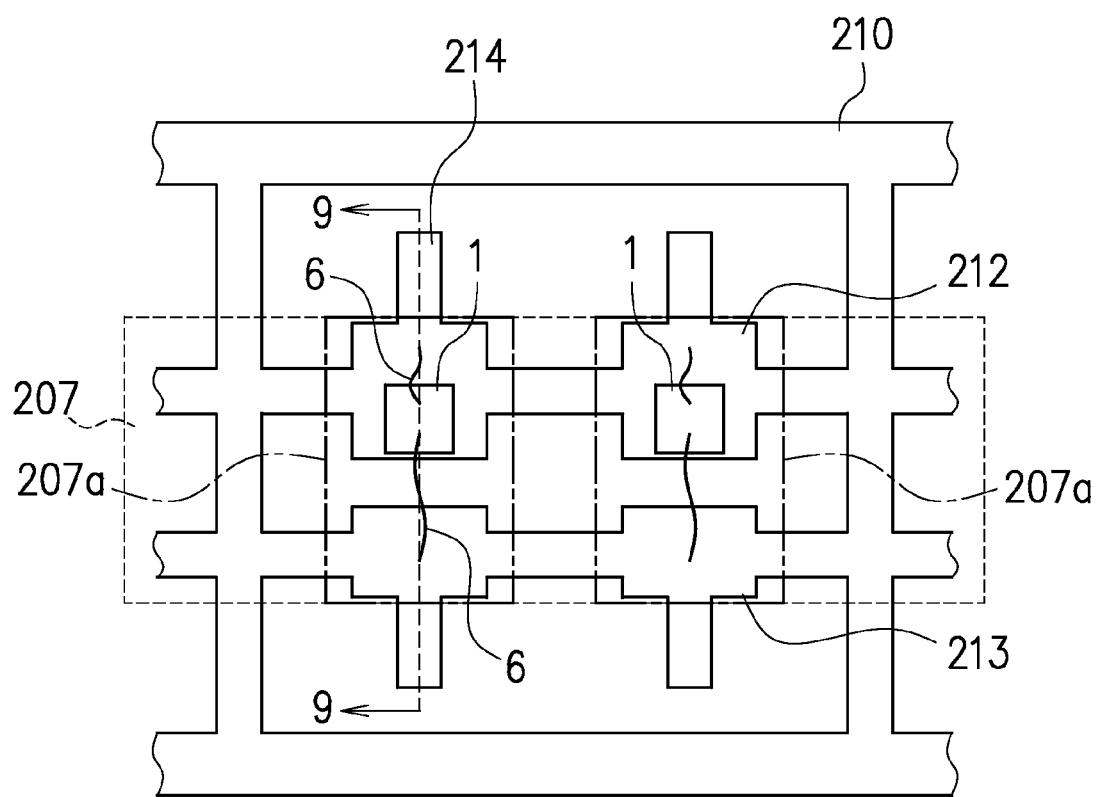
FIG. 8 is a plan view showing a state where LED elements are mounted on the lead frame as shown in FIG. 7.
Figure 9A:
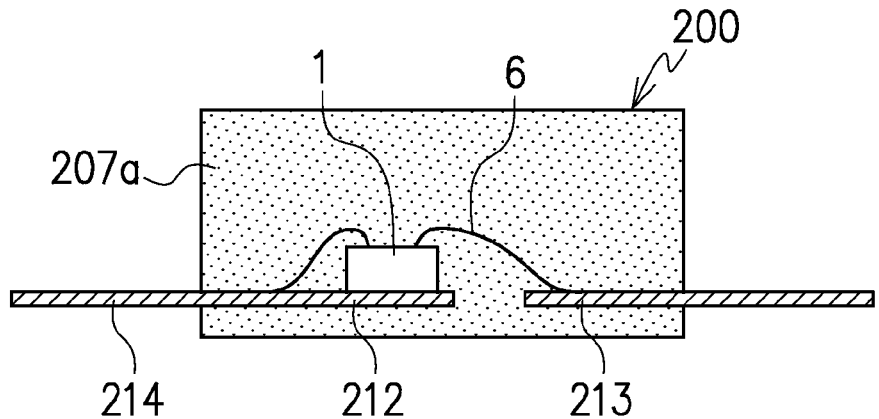
FIGS. 9A to 9C are sectional views taken along the line 9-9 in FIG. 8, showing processes for manufacturing a light-emitting device using the lead frame.
Figure 9B:
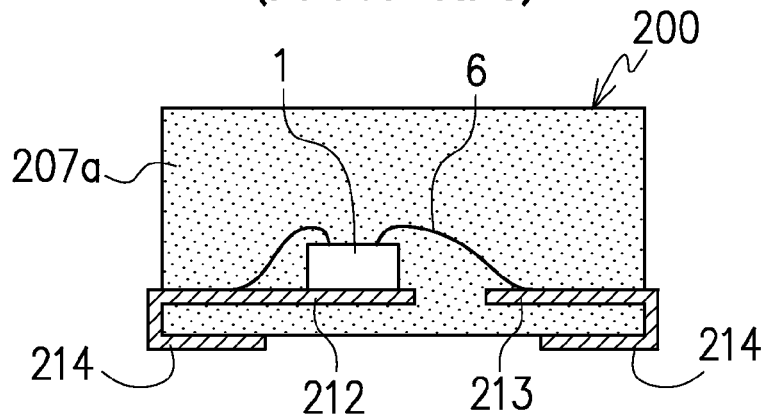
Figure 9C:
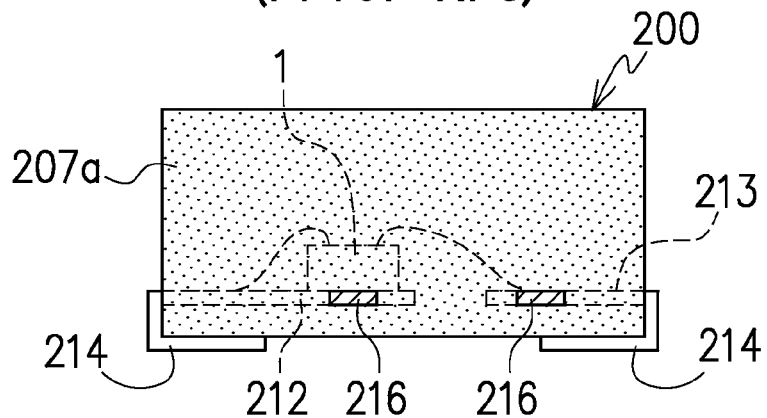
Figure 10A:
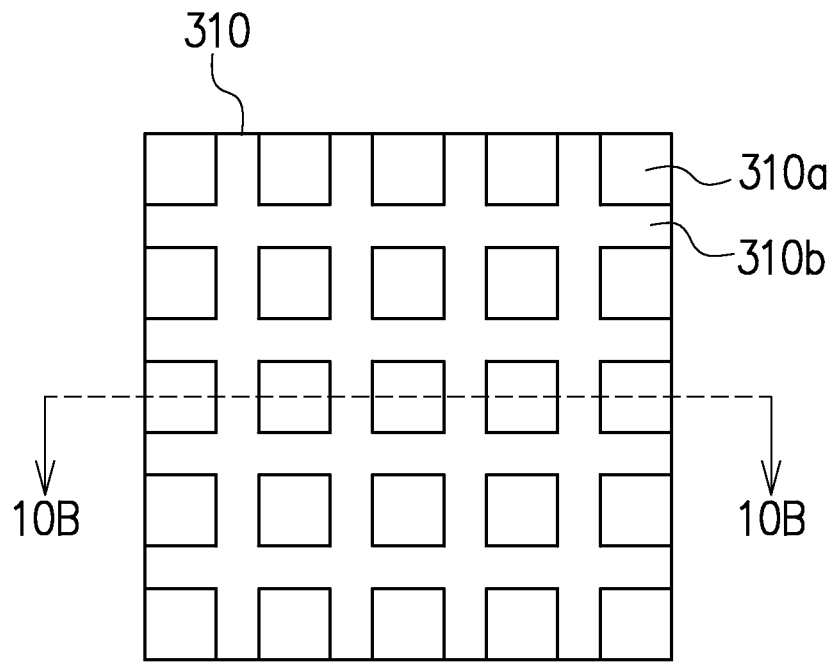
FIG. 10A is a plan view of a metallic base constituting another conventional light-emitting device.
Figure 10B:
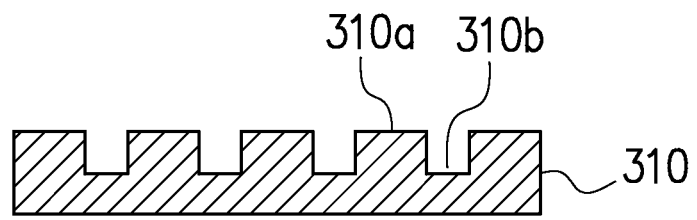
FIG. 10B is a sectional view taken along the line 10B-10B in FIG. 10A, showing the metallic base as shown in FIG. 10A.

Next, another embodiment of a light-emitting device obtained by a method of manufacturing a light-emitting device according to the present invention is described with reference to FIGS. 4 and 5. Here, because the light-emitting device 70 according to this embodiment is basically the same in structure as the light-emitting device 10 shown in FIGS. 1 and 2, identical reference numbers are attached to similar parts to those in the light-emitting device 10, and duplicate description is omitted.

The light-emitting device 70 in the other embodiment differs from the light-emitting device 10 in that each of the first metallic plate 72 and the second metallic plate 73 of the light-emitting device 70 has a planar shape, and the first metallic plate 72 has a protrusion portion 72t protruding from at least one side of the first metallic plate 72 into the resin 4 and the second metallic plate 73 has a protrusion portion 73t protruding from at least one side of the second metallic plate 73 into the resin 4.

In this case, the protrusion portions 72t and 73t on the first metallic plate 72 and the second metallic plate 73 increase the connecting strength between the resin 4 and the first and second metallic plates 72, 73 by anchor effect of the convex shapes. This results in high strength of the planar board 5 and increased stabilization in mounting the LED element 1 on the planar board 5.

Meanwhile, the first metallic plate 72 and the second metallic plate 73 are not limited to the convex shapes including the protrusion portions 72t and 73t that protrude in opposite two directions, as shown in the second embodiment, and various shapes such as a combination of concave and convex portions, a combination of circular-arc shapes, or the like may be used to obtain more secure connection between the resin 4 and the first and second metallic plates.

As mentioned above, in the light-emitting devices obtained by the method according to the present invention, because the first metallic plate and the second metallic plate which have excellent heat-release property with at least lower surfaces exposed to outside of the light-emitting devices are integrally connected by the resin having a strength combining force to form a rigid planar board and the LED element is mounted on at least one of the first and second metallic plates, it is possible to achieve a light-emitting device with a good heat-release property and reliability. Also, use of the positioning frame to position the plurality of pairs of the first metallic plate and second metallic plate, and use of the planar board including a plurality of pairs of metallic plates make it possible to provide miniaturized and thinned light-emitting devices collectively.

Meanwhile, in the aforementioned embodiments, although the electrical connection between the element electrode of the LED element and each of the first and second metallic plates is performed by wire bonding, the electrical connection is not limited to this, as mentioned above. In addition, when the first metallic plate and the second metallic plate in a pair are formed having the same shape as each other, the number of parts can be reduced and processes where LED elements are arranged on the positioning frame can be simplified. The processes can be further simplified if the basic portions (except protrusions) of the first and second metallic plates are square shaped.

Although preferred embodiments of the present invention have been described, it should be understood that the present invention is not limited to these embodiments, and that various changes and modifications can be made to the embodiments.

What is claimed is:

1. A method of manufacturing a light-emitting device comprising:

positioning at least one first metallic plate in at least one first concave portion of a positioning frame and at least one second metallic plate in at least one second concave portion of the positioning frame;

adhering a surface of an adhesive sheet to the first metallic plate in the first concave portion of the positioning frame and the second metallic plate in the second concave portion of the positioning frame;

removing the first metallic plate and the second metallic plate that are adhered to the adhesive sheet, from the first concave portion and the second concave portion of the positioning frame;

filling a resin in spaces except the first metallic plate and the second metallic plate on the surface of the adhesive sheet to form a planar board including the first metallic plate and the second metallic plate connected by the resin;

removing the adhesive sheet from the planar board;

mounting at least one light-emitting diode element that includes a pair of a first element electrode and a second element electrode, on the first metallic plate;

electrically connecting one of the first and second element electrodes of the light-emitting diode element, to the second metallic plate by at least one wire; and forming a sealing resin on a side of the planar board, the side being a side where the light-emitting diode element is mounted on the first metallic plate.

2. The method of manufacturing a light-emitting device according to claim 1 comprising:

positioning a plurality of pairs of the first metallic plate and the second metallic plate in a plurality of pairs of the first concave portion and the second concave portion of a positioning frame;

adhering a surface of an adhesive sheet to the plurality of pairs of the first metallic plate and the second metallic plate;

removing the plurality of pairs of the first metallic plate and the second metallic plate that are adhered to the adhesive sheet, from the plurality of pairs of the first concave portion and the second concave portion of the positioning frame;

filling a resin in spaces except the plurality of pairs of the first metallic plate and the second metallic plate on the surface of the adhesive sheet to form a planar board including the plurality of pairs of the first metallic plate and the second metallic plate connected by the resin;

removing the adhesive sheet from the planar board;

mounting a plurality of light-emitting diode elements each including the first and second element electrodes, on the first metallic plates of the plurality of pairs;

electrically connecting the second element electrodes of the light-emitting diode elements, to the second metallic plates by wires;

forming a sealing resin on a side of the planar board, the side being a side where the plurality of light-emitting diode elements are mounted on the first metallic plates; and dividing the sealing resin on the planar board into a plurality of light-emitting diode devices.

3. The method of manufacturing a light-emitting device according to claim 1 comprising:

when electrically connecting one of the first and second element electrodes of the light-emitting diode element to the second metallic plate by at least one wire, electrically connecting another of the first and second element electrodes of the light-emitting diode element to the first metallic plate by at least one wire.

4. The method of manufacturing a light-emitting device according to claim 2 comprising:

when electrically connecting the second element electrodes of the light-emitting diode elements to the second metallic plates by wires, electrically connecting the first element electrodes of the light-emitting diode elements to the first metallic plates by wires.

5. A method of manufacturing a light-emitting device comprising:

positioning at least one first metallic plate in at least one first concave portion of a positioning frame and at least one second metallic plate in at least one second concave portion of the positioning frame;

adhering a surface of an adhesive sheet to the first metallic plate in the first concave portion of the positioning frame and the second metallic plate in the second concave portion of the positioning frame;

removing the first metallic plate and the second metallic plate that are adhered to the adhesive sheet, from the first concave portion and the second concave portion of the positioning frame;

filling a resin in spaces except the first metallic plate and the second metallic plate on the surface of the adhesive sheet to form a planar board including the first metallic plate and the second metallic plate connected by the resin;

removing the adhesive sheet from the planar board;

mounting at least one light-emitting diode element that includes a pair of element electrodes, on the first metallic plate and the second metallic plate, with the respective element electrodes of the light-emitting diode element in contact with the respective first and second metallic plates through bumps; and forming a sealing resin on a side of the planar board, the side being a side where the light-emitting diode element is mounted on the first metallic plate and the second metallic plate.

6. The method of manufacturing a light-emitting device according to claim 5 comprising:

positioning a plurality of pairs of the first metallic plate and the second metallic plate in a plurality of pairs of the first concave portion and the second concave portion of a positioning frame;

adhering a surface of an adhesive sheet to the plurality of pairs of the first metallic plate and the second metallic plate;

removing the plurality of pairs of the first metallic plate and the second metallic plate that are adhered to the adhesive sheet, from the plurality of pairs of the first concave portion and the second concave portion of the positioning frame;

filling a resin in spaces except the plurality of pairs of the first metallic plate and the second metallic plate on the surface of the adhesive sheet to form a planar board including the plurality of pairs of the first metallic plate and the second metallic plate connected by the resin;

removing the adhesive sheet from the planar board;

mounting each of a plurality of light-emitting diode elements that each include a pair of a first element electrode and a second element electrode, on the first metallic plate and the second metallic plate of each pair, with the first element electrode in contact with the first metallic plate of each pair and with the second element electrode in contact with the second metallic plate of each pair through bumps;

forming a sealing resin on a side of the planar board, the side being a side where the plurality of light-emitting diode elements are mounted on the first metallic plates; and dividing the sealing resin on the planar board into a plurality of light-emitting diode devices.

* * * * *